(12) United States Patent
Tayrani

(10) Patent No.: US 7,265,619 B2
(45) Date of Patent: Sep. 4, 2007

(54) TWO STAGE MICROWAVE CLASS E POWER AMPLIFIER

(75) Inventor: Reza Tayrani, Marina Del Rey, CA (US)

(73) Assignee: Raytheon Company, Waltham, MA (US)

( * ) Notice: Subject to any disclaimer, the term of this patent is extended or adjusted under 35 U.S.C. 154(b) by 134 days.

(21) Appl. No.: 11/178,113

(22) Filed: Jul. 6, 2005

(65) Prior Publication Data

US 2007/0008034 A1 Jan. 11, 2007

(51) Int. Cl.
H03F 3/217 (2006.01)

(52) U.S. Cl. .................................. 330/251; 330/207 A

(58) Field of Classification Search ................ 330/251, 330/207 A, 302, 292, 294
See application file for complete search history.

(56) References Cited

U.S. PATENT DOCUMENTS

| 3,919,656 | A | 11/1975 | Sokal et al. |
| 5,535,438 | A | 7/1996 | Sevic |
| 6,472,934 | B1 | 10/2002 | Pehlke |
| 6,552,610 | B1 * | 4/2003 | Grebennikov et al. ...... 330/251 |
| 6,784,732 | B2 * | 8/2004 | Hajimiri et al. ............ 330/251 |
| 6,879,209 | B2 * | 4/2005 | Grundlingh ................. 330/251 |
| 6,956,438 | B2 * | 10/2005 | Kuriyama et al. .......... 330/302 |

OTHER PUBLICATIONS

Wilkinson A J et al: "Transmission-Line Load-Network Topology for Class-E Power Amplifiers" IEEE, vol. 49, No. 6 part 2, pp. 1202-1210XP001093563, fig 1,3,4,14,15,18.

Sokol N O et al: "Class-E-A New Class of High-Effciency Tuned Single-Ended Switching Power Amplifiers" XP000601709, Figures, 3,6,7.
Tayrani R Ed—Institute of Electrical and Electronic Engineers: A Monolitic X-Band Class-E Power Amplifier, XP001046990, figures 1,4.
Kazimierczuk M K et al: "Class-E Amplifier With an Inductive Impedance Inverter" XP000115744, figure 1.
Kawahara T et al: "Class E frequency multiplier driving Class E amplifier" XP 010261410, figure 9.
Kazimierczuk M K et al: Class-E DC/DC Converters With a Capacitive Impedance Inverter; XP00047832 figure 1.
Sowlati T et al: "1.8ghz Class E Power Amplifier for Wireless Communications" Figure 1.
Popovic Z et al: "Efficient X-Band Switched-Mode Microwave Power Amplifiers" XP010673644, figure 5.
Grebennikov A V et al Instutute of Electrical and Electronics Engineers, XP001113917, Figures 1,4,5.

* cited by examiner

Primary Examiner—Henry Choe
(74) Attorney, Agent, or Firm—Leonard A. Alkov

(57) ABSTRACT

A load circuit for use with a switching mode circuit. The novel load circuit includes a series inductive-capacitive network coupled to an output of the switching mode circuit and a circuit for providing a capacitance coupled to the output of the switching mode circuit. In an illustrative embodiment, the circuit for providing capacitance includes one or more lumped capacitors adapted to compensate for an intrinsic capacitance in the switching mode circuit. The load circuit may also include a shunt inductance coupled to the output of the switching mode circuit. In an illustrative embodiment, the load circuit is adapted to provide a Class-E load to a two-stage Class-E high power amplifier. The amplifier includes a driver stage, a novel Class-E inter-stage matching network (ISMN), and a high power stage using the novel load circuit.

34 Claims, 6 Drawing Sheets

TWO STAGE MICROWAVE CLASS E POWER AMPLIFIER

BACKGROUND OF THE INVENTION

1. Field of the Invention

The present invention relates to electrical and electronic circuits and systems. More specifically, the present invention relates to microwave Class E power amplifiers.

2. Description of the Related Art

Highly efficient microwave and radio frequency (RF) high power amplifiers are required for many commercial and military applications. Typical applications include wireless local area networks, cellular phones and telecommunication systems, as well as advanced airborne active phased array radar systems. Class-E power amplifiers are high-efficiency amplifiers that would be useful for these and other applications.

Class-E amplifiers are part of the "switching mode amplifiers" such as class D, E, F, etc. These types of amplifiers include a transistor that operates as a perfect switch with no overlapping voltage and current waveforms at its output terminal, thereby ideally dissipating zero DC power. Other classes of amplifiers such as class A, A/B and C, operate as current-sources with overlapping voltage and current waveforms and hence dissipate DC power, leading to a lower efficiency.

A Class-E amplifier typically consists of a single transistor and a resonant load network. The function of the load network is to shape the voltage and current waveforms at the active device output terminal to prevent simultaneous high voltage and high current in the transistor, thereby minimizing DC power dissipation. The active device acts as a switch, driven by an RF input signal to "ON" and "OFF" conditions. The operating point of the device is such that the device is either OFF (in the pinched-off region) or ON (in the linear region). Under an ideal switching operation condition, output voltage and current waveforms at the device output terminal do not exist simultaneously and, therefore, the energy dissipated within the device is zero, yielding a 100 percent theoretical power conversion efficiency.

Present class-E high power amplifiers (HPAs) have limited useful bandwidth due to their highly tuned load circuits. Class-E HPAs have generally been used at audio, HF and UHF frequencies for applications such as audio HI-FI. systems, Ham radios and high power plasma generation where narrow frequency bandwidth are required. In recent years, the published work on monolithic class-E power amplifiers has been limited to narrow band (less than 500 MHz) RF frequencies covering the hand set cell phone market.

In addition, conventional class-E amplifiers have limited power outputs. Class-E amplifiers are typically implemented using single stage designs. In order to increase gain, the size of the amplifier's active device is increased. Increasing the active device, however, reduces the frequency range of the amplifier due to the increased capacitance at the input of the device.

Hence, a need exists in the art for an improved Class-E amplifier offering simultaneous high power and high power added efficiency (PAE) over a broader frequency range.

SUMMARY OF THE INVENTION

The need in the art is addressed by the load circuit of the present invention. The novel load circuit is adapted for use with any switching mode circuit and includes a series inductive-capacitive network coupled to an output of the switching mode circuit and a circuit for providing a capacitance coupled to the output of the switching mode circuit. In an illustrative embodiment, the circuit for providing capacitance includes one or more lumped capacitors adapted to compensate for an intrinsic capacitance in the switching mode circuit. The load circuit may also include a shunt inductance coupled to the output of the switching mode circuit.

In an illustrative embodiment, the load circuit is adapted to provide a Class-E load to a two-stage Class-E high power amplifier. The amplifier includes a driver stage, a novel Class-E inter-stage matching network (ISMN), and a high power stage using the novel load circuit. The novel ISMN includes a first circuit for providing a Class-E load to the amplifier driver stage and a second circuit for providing a matched input impedance for the high power stage. The load circuit and the ISMN are both adapted to provide simultaneous high power added efficiency and high power over a broad frequency range.

BRIEF DESCRIPTION OF THE DRAWINGS

FIG. 2b is a distributed component implementation of the conventional Class-E load depicted in FIG. 2a.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
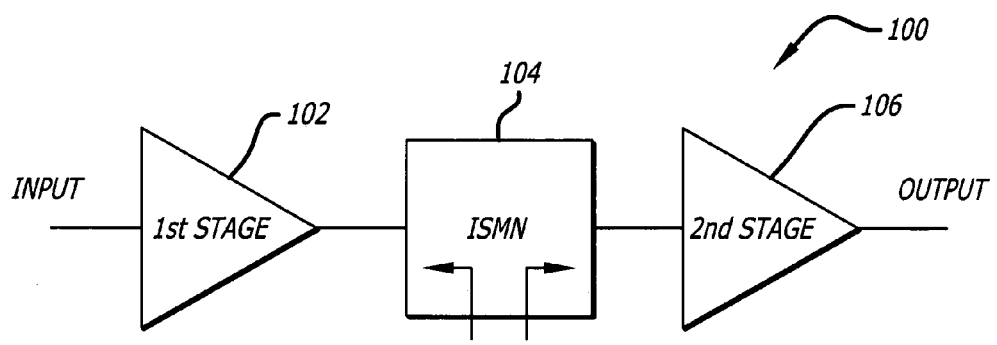
FIG. 1 is a simplified block diagram of an illustrative embodiment of a two-stage Class-E high power amplifier designed in accordance with the teachings of the present invention.

FIG. 1 is a simplified block diagram of an illustrative embodiment of a two-stage Class-E high power amplifier 100 designed in accordance with the teachings of the present invention. The circuit 100 is specifically synthesized for high power operation (5.0 W-10.0 W or greater), providing a simultaneous high power added efficiency (PAE) and high power over a broad frequency range (7-11 GHz). The amplifier 100 includes a driver stage (first stage) 102, a high power stage (second stage) 106, and a novel class-E interstage matching network (ISMN) 104 situated between the two stages. Both stages of the amplifier 100 possess unique broadband class-E loads. This design approach is contrary to the conventional class A/B HPA designs in which the driver stage is designed to operate in the linear region.

Figure 2A:
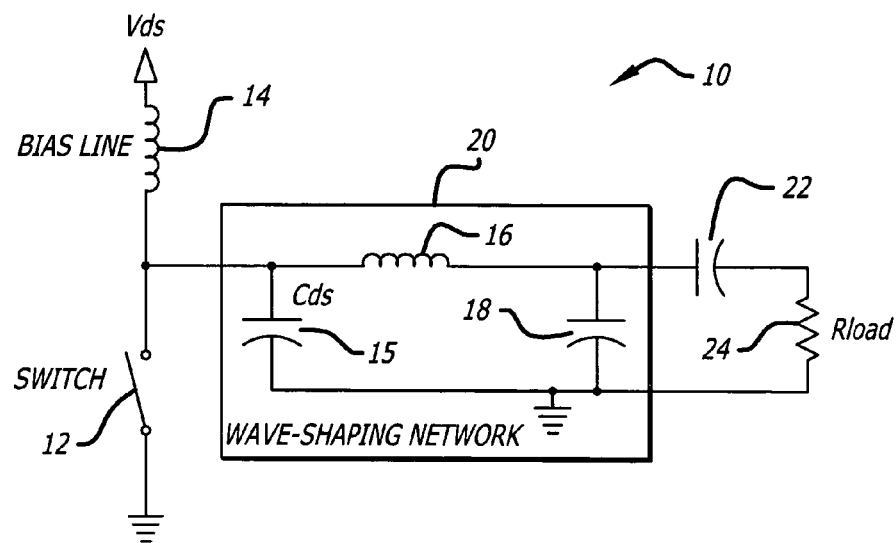
FIG. 2a is a simplified schematic diagram of a discrete component implementation of an amplifier with a conventional Class-E load.

The two-stage Class-E high power amplifier (HPA) of the present invention includes a novel Class-E load designed to maintain simultaneous high power and high PAE over a broad bandwidth. FIG. 2a is a simplified schematic diagram of a discrete component implementation of an amplifier 10 with a conventional Class-E load 20. As shown in FIG. 2a, a typical Class-E amplifier 10 includes a transistor represented by a switch 12, coupled to a voltage source $V_{ds}$ via an inductive bias line 14. The switch 12 is also coupled to a resistive load 24 via a capacitor 22 and an inverted L type (series L, shunt C) wave shaping load network 20. The conventional Class-E load network 20 includes a first shunt capacitor 15, which is the drain to source capacitance ($C_{ds}$) of the transistor switch 12, and a series inductor 16 followed by a shunt capacitor 18. Few design efforts have been made to optimize these circuits for broadband operation. Hence, in previous amplifier designs, the drain bias line 14 was treated independent of the load circuit 20, merely acting as a choke realized by a quarter wavelength length of transmission line.

Figure 2B:
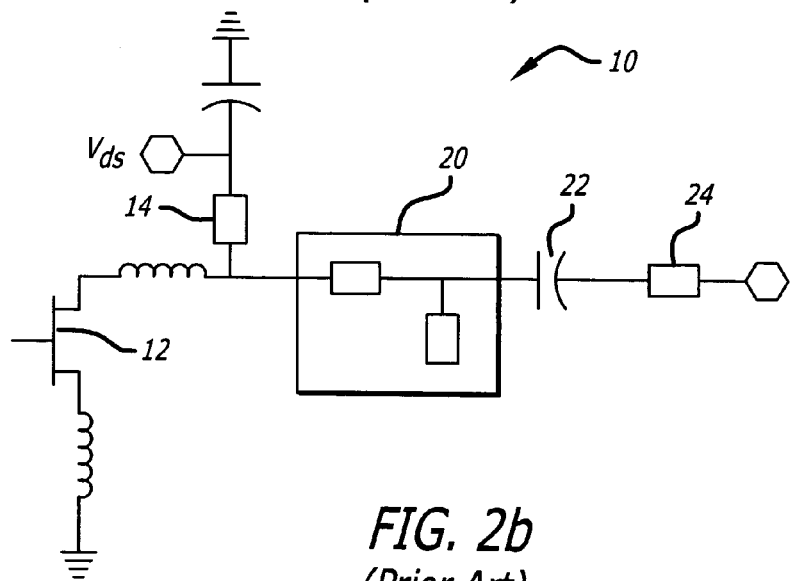

FIG. 2b is a distributed component implementation of the conventional Class-E load depicted in FIG. 2a. It is worth mentioning that the function of the load network in the class E amplifier is to shape the voltage and current waveforms. Therefore, for the design of a broadband Class-E amplifier, care should be taken to ensure Class-E waveforms exist over the entire frequency band. Conventional Class-E load circuits are operable only over a narrow bandwidth (about 500 MHz or less).

Figure 3:
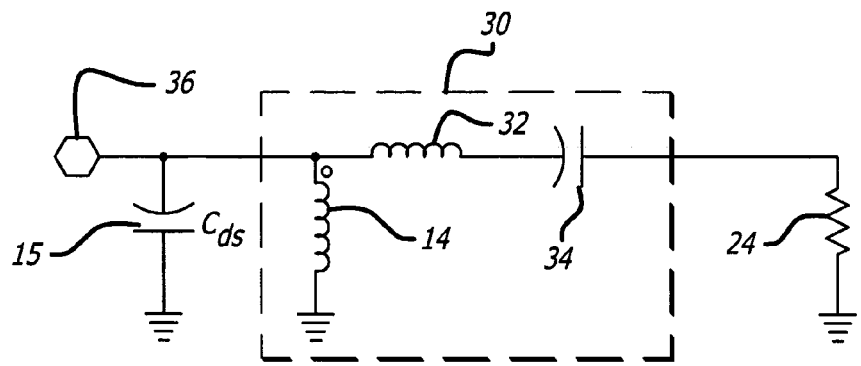
FIG. 3 is a simplified schematic diagram of a discrete component implementation of a prior art broadband Class-E load network.

FIG. 3 is a simplified schematic diagram of a discrete component implementation of a prior art broadband Class-E load network 30, as described in a patent application entitled "BROADBAND MICROWAVE AMPLIFIER", U.S. Ser. No. 11/054,968, filed Feb. 10, 2005, by R. Tayrani the teachings of which are incorporated herein by reference. This load topology is based on a series L-C (inductive-capacitive) network, and includes an inductive element 32 connected in series with a capacitive element 34 between the transistor output terminal 36 and the resistive load 24. The drain bias line is also included in the load design process as a shunt inductive element 14 coupled to the transistor output terminal 36. The intrinsic capacitance $C_{ds}$ of the active device is represented as a shunt capacitor 15 coupled to the transistor output terminal 36.

While this design provides superior broadband performance for medium power applications, it may not be as effective for high power amplifiers. In order to achieve greater RF power, a high power amplifier typically includes a larger active device (gate periphery greater than 5.0 mm), which generally is realized by combining several active devices in parallel. However, care must typically be taken in combining active devices in parallel as it may reduce the useful frequency range of the amplifier due to the intrinsic capacitance and other associated device extrinsic parasitics, thereby further reducing the operational bandwidth of the circuit.

Figure 4:
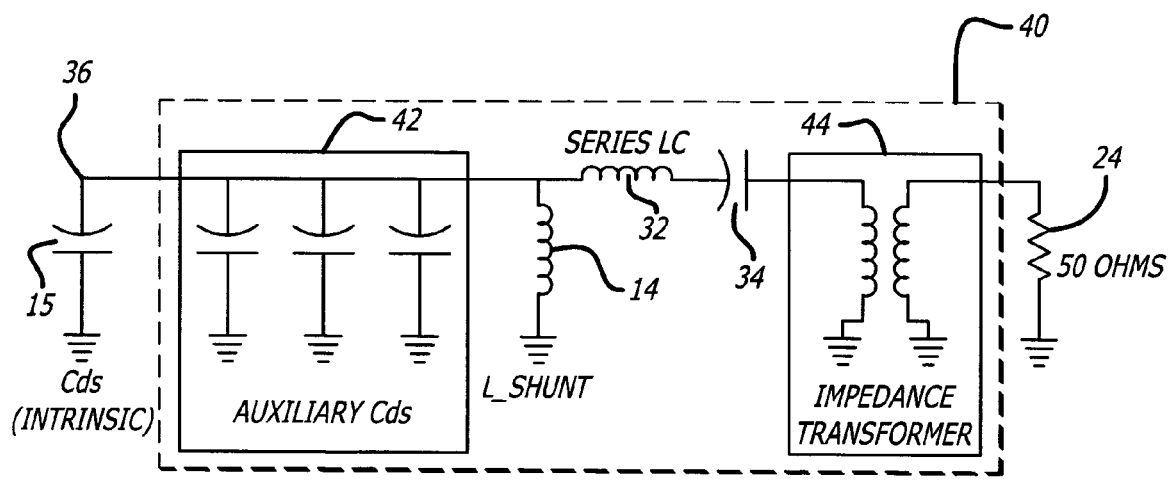
FIG. 4 is a simplified schematic diagram of a discrete component implementation of an illustrative embodiment of a Class-E load network designed in accordance with the teachings of the present invention.

In accordance with the teachings of the present invention, auxiliary capacitors are added to a series L-C load network to compensate for the intrinsic capacitance of the active device. FIG. 4 is a simplified schematic diagram of a discrete component implementation of an illustrative embodiment of a Class-E load network 40 designed in accordance with the teachings of the present invention. The novel load network 40 includes one or more lumped capacitors 42 coupled to the output terminal 36 of the active device. The lumped capacitors 42 are designed to compensate for the intrinsic active device capacitance $C_{ds}$ (represented in FIG. 4 as a shunt capacitor 15 coupled to the transistor output terminal 36). An inductive element 32 is connected in series with a capacitive element 34 between the transistor output terminal 36 and a broadband impedance transformer 44. The impedance transformer 44 transforms the output impedance of the circuit to match the impedance of the resistive load 24, which in the illustrative embodiment is 50.0 Ohms. The drain bias line is also included in the load design process as a shunt inductive element 14 coupled to the transistor output terminal 36.

The lumped load shown in FIG. 4 has to be transformed to its equivalent distributed network to render it useful for application at X-band and other microwave frequency bands. To optimize the distributed load for Class-E operation, a time domain optimization process is performed. Further details on a design methodology for broadband circuits can be found in the above referenced patent application.

Figure 5:
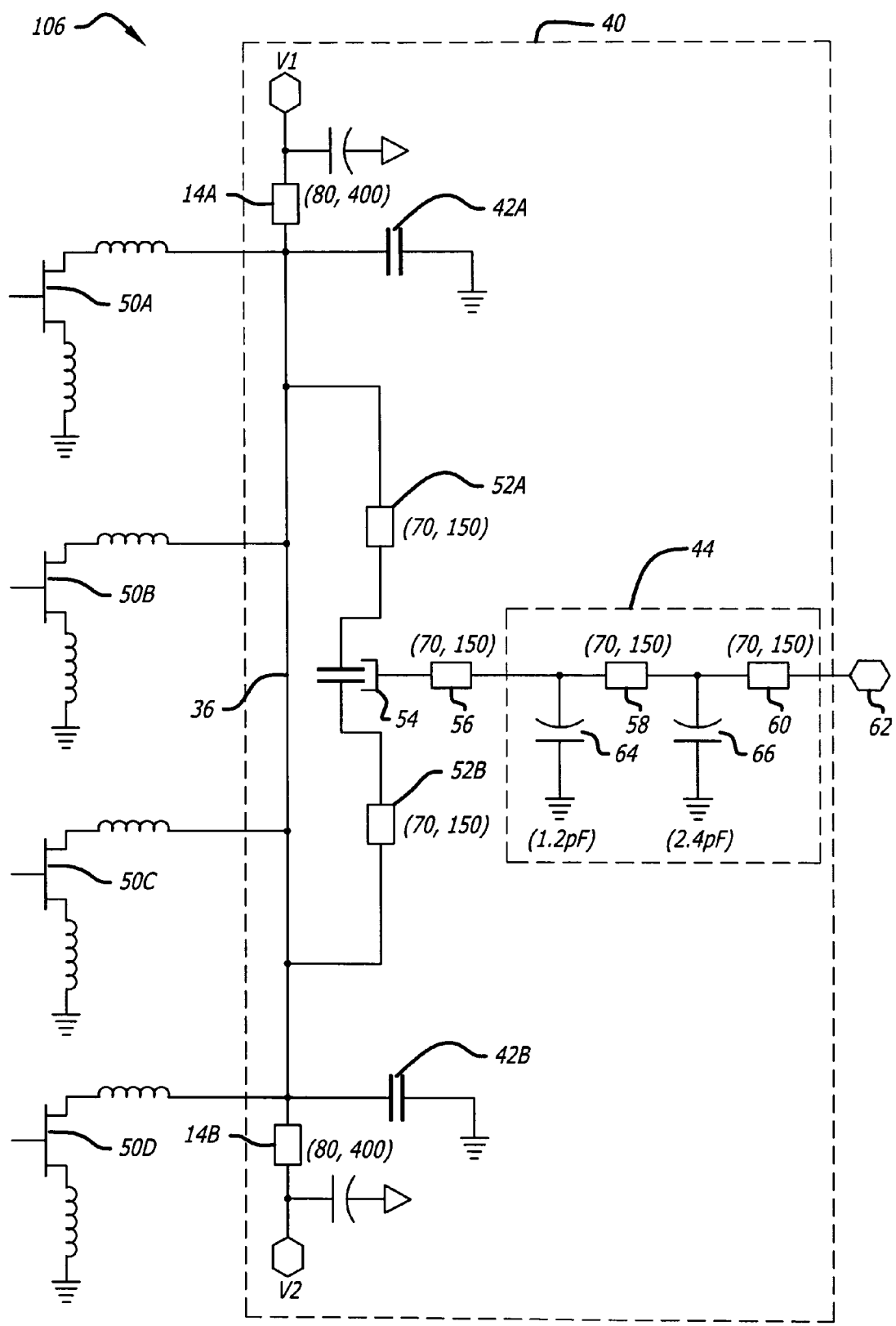
FIG. 5 is a distributed component implementation of the Class-E load depicted in FIG. 4.

FIG. 5 is a distributed component implementation of the Class-E load depicted in FIG. 4. The load network 40 shown in FIG. 5 is designed for use in the second stage 106 of the novel high power amplifier 100 of FIG. 1. In the illustrative embodiment, the second amplifier stage 106 includes four transistors 50A, 50B, 50C, and 50D connected in parallel. The outputs (drains) of the transistors are connected together at node 36. In this embodiment, the load network 40 includes two adjustable lumped capacitors 42A and 42B coupled to node 36. Two bias drain lines 14A and 14B couple the transistor output node 36 to voltage sources V1 and V2, respectively. The series L-C network is implemented by two transmission lines 52A and 52B, which couple the transistor output node 36 to a three-port capacitor 54. A transmission line 56 couples the three-port capacitor 54 to the impedance transformer 44. The impedance transformer 44 is implemented using two transmission lines 58 and 60 connected in series between line 56 and an output terminal 62. A shunt capacitor 64 is connected between lines 56 and 58, and a shunt capacitor 66 is connected between lines 58 and 60. Illustrative values for the width and length dimensions of the transmission lines are shown in microns in FIG. 5. Other implementations may also be used without departing from the scope of the present teachings.

Figure 6:
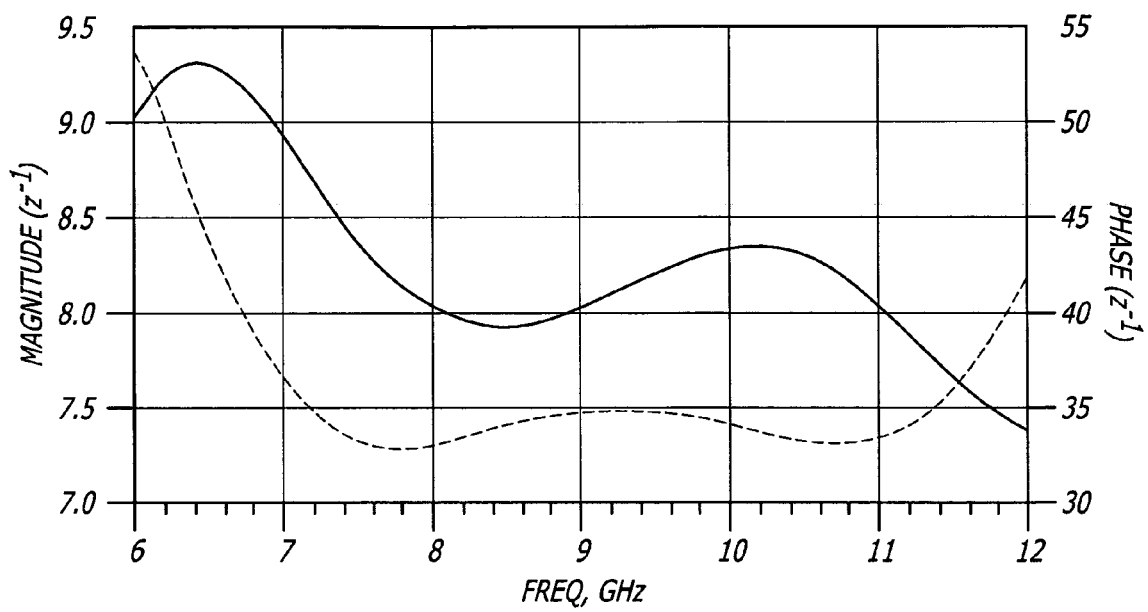
FIG. 6 is a graph showing the frequency response of the distributed load of FIG. 5.

The novel Class-E load 40 of the present invention is suitable for high power operation, and is especially useful for large active devices, as used in the second stage of the illustrative HPA of FIG. 1. The circuit 40 provides a simultaneous high PAE and high power over a broadband frequency range (7-11 GHz in the illustrative embodiment). FIG. 6 is a graph showing the frequency response of the distributed load 40 of FIG. 5, illustrating a broadband nearly frequency independent phase and magnitude response over the frequency range 7-11 GHz. This type of frequency response is the necessary requirement to the broadband operation of a Class-E HPA. Those of ordinary skill in the art may extend the present teachings to other frequencies without departing from the scope thereof.

Figure 7:
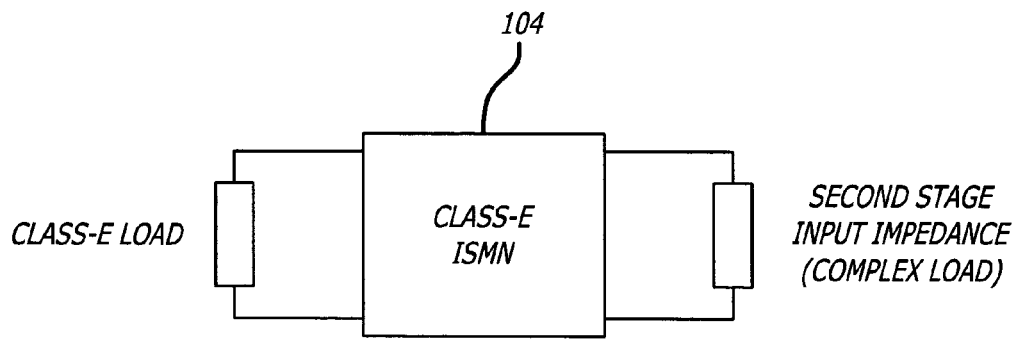
FIG. 7 is a representation of a Class-E ISMN in accordance with the teachings of the present invention.

Returning to FIG. 1, the two-stage Class-E high power amplifier 100 of the present invention also includes a novel Class-E inter-stage matching network (ISMN) 104 designed to maintain simultaneous high power and high PAE over a broad bandwidth. An ISMN is necessary when designing a two-stage amplifier. The ISMN circuit could be said is similar to a band-pass filter having unequal complex loads at its input/output ports. In the case of the Class-E ISMN circuit 104, the complex load has to be a frequency independent Class-E load. This load (which is the Class-E load for the first amplifier stage 102) then is matched to the complex input impedance of the second amplifier stage 106 over the desired bandwidth. FIG. 7 is a representation of a Class-E ISMN 104, illustrating this concept.

Figure 8A:
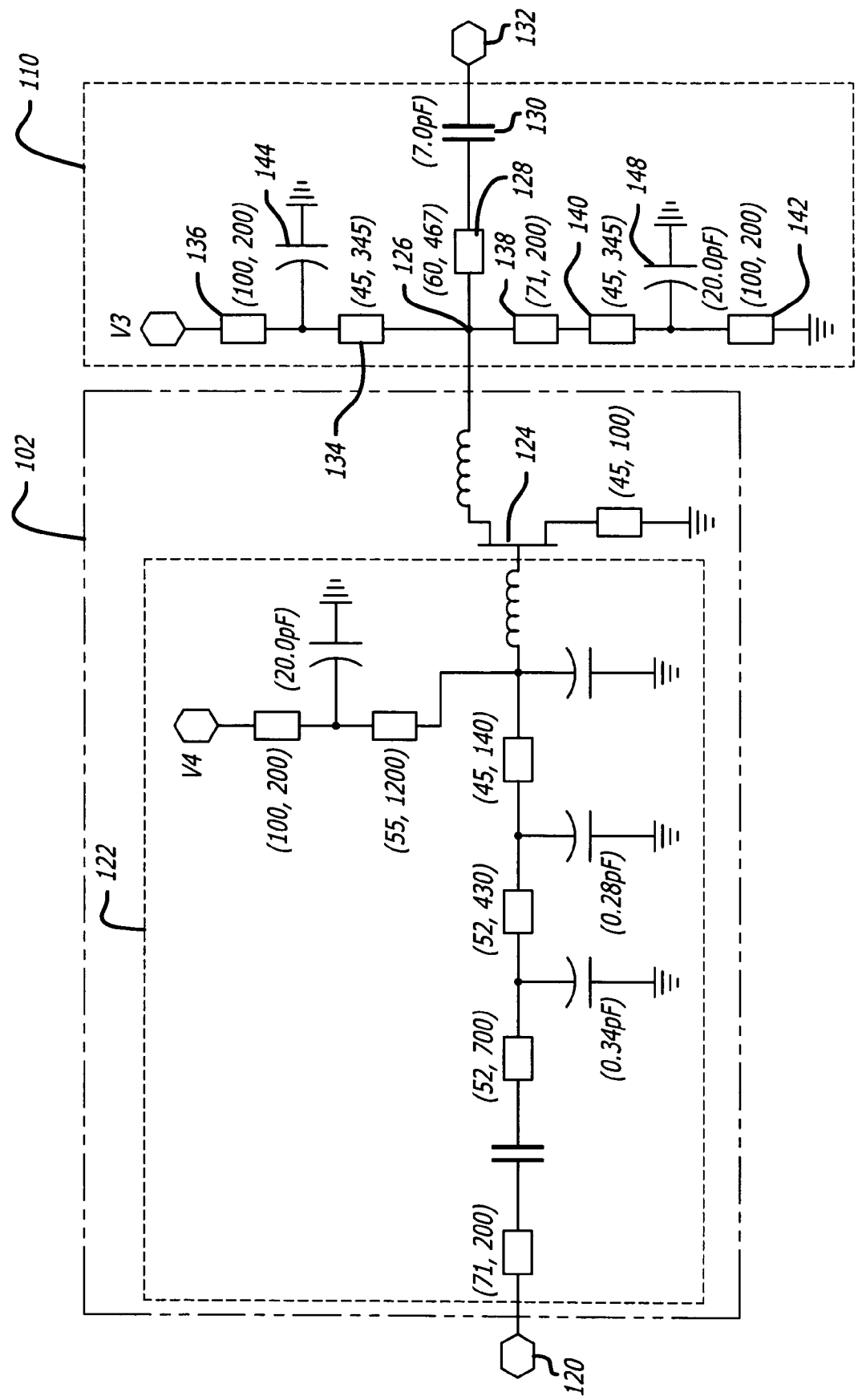
FIG. 8a is a simplified schematic diagram showing a distributed component implementation of an illustrative embodiment of the first amplifier stage and a first circuit of the Class-E ISMN designed in accordance with the teachings of the present invention.
Figure 8B:
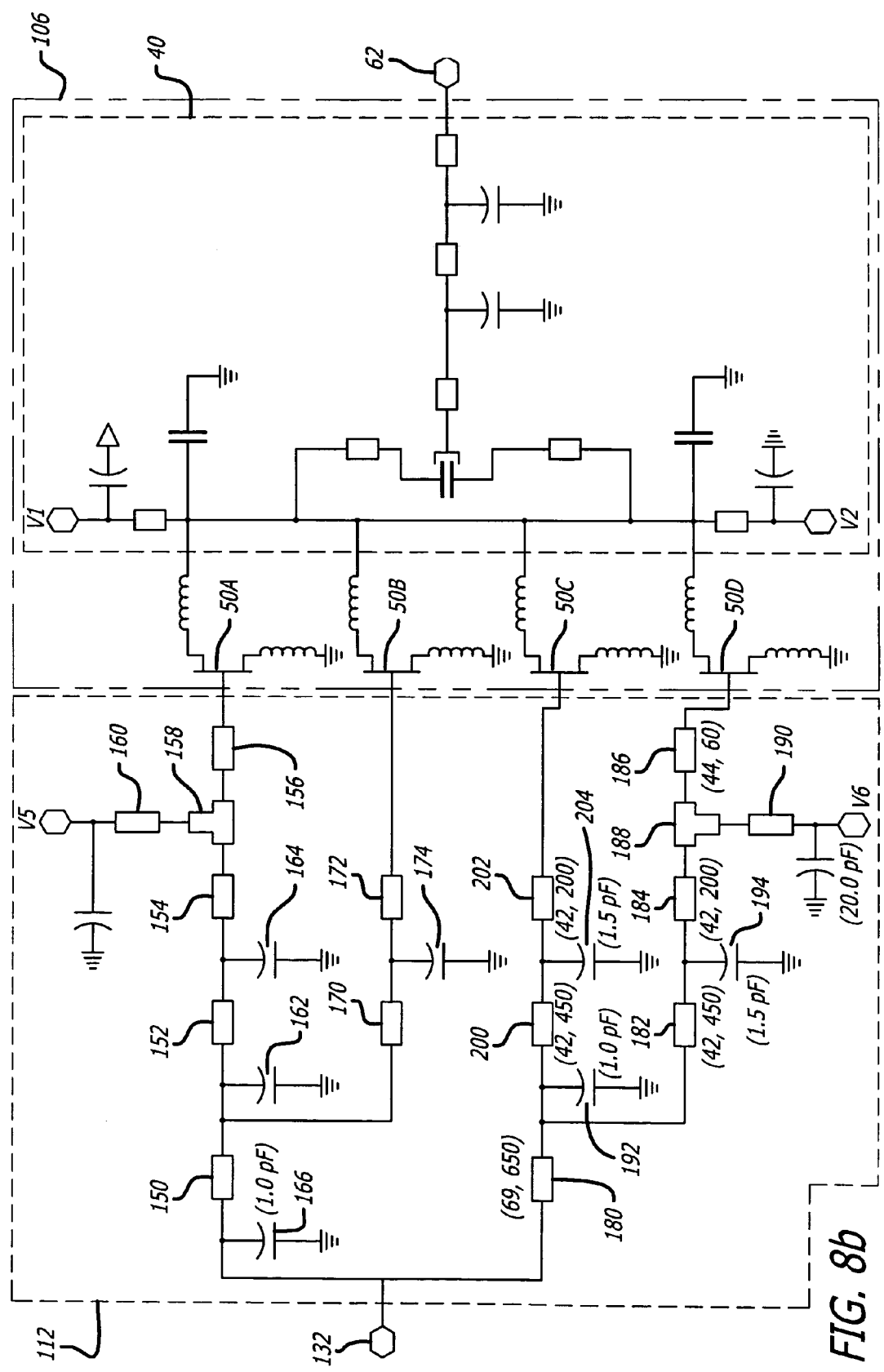
FIG. 8b is a simplified schematic diagram showing a distributed component implementation of an illustrative embodiment of a second circuit of the Class-E ISMN and the second amplifier stage designed in accordance with the teachings of the present invention.

The novel Class-E ISMN 104 includes a first circuit 110 for providing a Class-E load to the first amplifier stage 102, and a second circuit 112 for providing a matched input impedance for the second amplifier stage 106. FIGS. 8a and 8b show the details for the novel two-stage Class-E HPA 100 of the present invention: FIG. 8a shows the first amplifier stage 102 and the first portion 110 of the ISMN, and FIG. 8b shows the second portion 112 of the ISMN and the second amplifier stage 106.

FIG. 8a is a simplified schematic diagram showing a distributed component implementation of an illustrative embodiment of the first amplifier stage 102 and first circuit 110 of the Class-E ISMN designed in accordance with the teachings of the present invention. The first amplifier stage 102 includes an active device 124 and an input matching network 122 for coupling an input terminal 120 to the input of the active device 124. In the illustrative embodiment, the active device 124 is a pseudo-morphic, high-electron mobility transistor (pHEMT). The output (drain) of the active device 124 is connected to the first circuit 110 of the ISMN.

The first circuit 110 of the ISMN provides a broadband Class-E load to the first amplifier stage 102. In the illustrative embodiment, the circuit 110 is based on a series L-C network and includes a transmission line 128 connected in series with a capacitive element 130 between the active device output 126 and a node 132. Two transmission lines 134 and 136 are connected in series between the transistor output 126 and a voltage supply V3. A shunt capacitor 144 is coupled between the lines 134 and 136. Three transmission lines 138, 140 and 142 are connected in series between the transistor output 126 and ground.

Optionally, the first circuit 110 of the ISMN may also include auxiliary lumped capacitors coupled to the transistor output 126 to compensate for the intrinsic capacitance of the active device 124. The first circuit 110 of the ISMN thus uses a similar approach as the Class-E load described above. In the illustrative embodiment, auxiliary capacitors are not needed in the ISMN because the first amplifier stage 102 is a driver stage providing lower power (and therefore a smaller active device 124) than the second amplifier stage 106. The addition of auxiliary lumped capacitors to the first circuit 100 of the ISMN may be desirable for a higher power first amplifier stage or for higher frequency operation.

FIG. 8b is a simplified schematic diagram showing a distributed component implementation of an illustrative embodiment of the second circuit 112 of the Class-E ISMN and the second amplifier stage 106 designed in accordance with the teachings of the present invention. In the illustrative embodiment, the second amplifier stage 106 includes four active devices 50A, 50B, 50C, and 50D connected in parallel, and a broadband Class-E load 40, the details of which were shown in FIG. 5. In the illustrative embodiment, the active devices 50A, 50B, 50C, and 50D are implemented using pHEMTs.

The second circuit 112 of the ISMN provides matched input impedances to the inputs of the active devices 50A, 50B, 50C, and 50D in the second amplifier stage 106. In the illustrative embodiment, the second circuit 112 includes four transmission lines 150, 152, 154, and 156 connected in series between the node 132 and the input of the transistor 50A. A three-port junction 158 connects the lines 154 and 156 to a transmission line 160, which is coupled to a voltage supply V5. A shunt capacitor 162 is coupled between lines 150 and 152, and a shunt capacitor 164 is coupled between lines 152 and 154. A shunt capacitor 166 is coupled to node 132. Two transmission lines 170 and 172 are connected in series between the capacitor 162 and the input of transistor 50B. A shunt capacitor 174 is coupled between lines 170 and 172.

Similarly for the other two transistors, four transmission lines 180, 182, 184, and 186 are connected in series between the node 132 and the input of the transistor 50D. A three-port junction 188 connects the lines 184 and 186 to a transmission line 190, which is coupled to a voltage supply V6. A shunt capacitor 192 is coupled between lines 180 and 182, and a shunt capacitor 194 is coupled between lines 182 and 184. Two transmission lines 200 and 202 are connected in series between the capacitor 192 and the input of transistor 50C. A shunt capacitor 204 is coupled between lines 200 and 202.

Thus, the present teachings provide an efficient high power, broadband HPA by synthesizing a new class of miniature broadband Class-E loads that are technology independent and therefore are suitable for monolithic integration in GaAs, GaN and/or SiGe MMIC technologies. The most important properties of these new loads are their ability to provide a simultaneous PAE and power over the entire bandwidth. In a preferred embodiment, the HPA is designed using a circuit simulation technique including time domain analysis, Harmonic Balance analysis, large signal stability analysis, and envelop simulation. By applying these new circuits and their associated unique design methodology for the design of switching mode power amplifiers, highly efficient (PAE>80 at X-band) HPAs can be designed.

Thus, the present invention has been described herein with reference to a particular embodiment for a particular application. Those having ordinary skill in the art and access to the present teachings will recognize additional modifications, applications and embodiments within the scope thereof. For example, the present teachings are not limited to Class-E amplifiers. That is, the present teachings may be used in connection with any switching amplifier or circuit design.

What is claimed is:

1. A load circuit for use with a switching mode circuit comprising:
  first means for providing a series inductive-capacitive network coupled to an output of said switching mode circuit;
  second means for providing a capacitance coupled to said output of said switching mode circuit; and
  third means for transforming an output impedance of the load circuit to match a desired impedance.

2. The invention of claim 1 wherein said capacitance compensates for an intrinsic capacitance in said switching mode circuit.

3. The invention of claim 1 wherein said second means includes one or more lumped capacitors.

4. The invention of claim 1 wherein said load circuit further includes fourth means for providing a shunt inductance coupled to said output of said switching mode circuit.

5. The invention of claim 1 wherein said load circuit provides a Class-E load.

6. The invention of claim 1 wherein said load circuit provides a simultaneous high power added efficiency and high power over a broad frequency range.

7. A Class-E load circuit for use with a switching mode circuit comprising:
  a series inductive-capacitive network coupled to an output of said switching mode circuit;
  one or more lumped capacitors coupled to said output of said switching mode circuit to compensate for an intrinsic capacitance in said switching mode circuit; and
  an impedance transformer coupled to said series inductive-capacitive network.

8. The invention of claim 7 wherein said load circuit further includes a shunt inductive element coupled to said output of said switching mode circuit.

9. The invention of claim 8 wherein said shunt inductive element includes an inductive bias line for said switching mode circuit.

10. The invention of claim 7 wherein said series inductive-capacitive network includes an inductive element coupled to said output of said switching mode circuit.

11. The invention of claim 10 wherein said series inductive-capacitive network further includes a capacitive element coupled in series to said inductive element.

12. An inter-stage matching network for coupling a first circuit with a second circuit comprising:
  first means for providing a Class-E load to said first circuit; and
  second means for providing a matched input impedance for said second circuit,
  wherein said inter-stage matching network is operable at frequencies in the range of 7-11 GHz.

13. The invention of claim 12 wherein said first means includes a series inductive-capacitive network coupled to an output of said first circuit.

14. The invention of claim 13 wherein said first means further includes a shunt inductive element coupled to said output of said first circuit.

15. The invention of claim 13 wherein said first means further includes one or more lumped capacitors coupled to said output of said first circuit to compensate for an intrinsic capacitance in said first circuit.

16. The invention of claim 12 wherein said inter-stage matching network provides a simultaneous high power added efficiency and high power over a broad frequency range.

17. A two-stage Class-E high power amplifier comprising:
  a driver stage, including an active device;
  a high power stage; and
  an inter-stage matching network disposed between said driver stage and said high power stage and adapted to provide a Class-E load to said driver stage and a matched input impedance for said high power stage, wherein said inter-stage matching network includes a series inductive-capacitive network for providing a Class-E coupled to an output of said active device.

18. The invention of claim 17 wherein said driver stage further includes an input matching network coupled to an input of said active device.

19. The invention of claim 17 wherein said inter-stage matching network is adapted to provide a simultaneous high power added efficiency and high power over a broad frequency range.

20. The invention of claim 17 wherein said high power stage includes one or more active devices connected in parallel.

21. The invention of claim 20 wherein said inter-stage matching network further includes a circuit for transforming an output of said series inductive-capacitive network to desired input impedances at inputs of said active devices of said high power stage.

22. The invention of claim 20 wherein said high power stage further includes a Class-E load network coupled to outputs of said active devices.

23. The invention of claim 22 wherein said load network includes a series inductive-capacitive network coupled to said outputs of said active devices.

24. The invention of claim 23 wherein said load network further includes one or more lumped capacitors coupled to said outputs of said active devices to compensate for intrinsic capacitances in said active devices.

25. The invention of claim 22 wherein said load network is adapted to provide a simultaneous high power added efficiency and high power over a broad frequency range.

26. A load circuit for use with a switching mode circuit comprising:
  first means for providing a series of inductive-capacitive network coupled to an output of said switching mode circuit; and
  second nicans for providing a capacitance coupled to said output of said switching mode circuit;
  wherein said load circuit is operable at frequencies in the range of 7-11 GHz.

27. The invention of claim 26 wherein said capacitance compensates for an intrinsic capacitance in said switching mode circuit.

28. The invention of claim 26 wherein said second means includes one or more lumped capacitors.

29. The invention of claim 26 wherein said load circuit further includes fourth means for providing a shunt inductance coupled to said output of said switching mode circuit.

30. The invention of claim 26 wherein said load circuit provides a Class-E load.

31. The invention of claim 26 wherein said load circuit provides a simultaneous high power added efficiency and high power over a broad frequency range.

32. A Class-E load circuit for use with a switching mode circuit comprising:
  a series of inductive-capacitive network coupled to an output of said switching mode circuit;
  one or more lumped capacitors coupled to said output of said switching mode circuit to compensate for an intrinsic capacitance in said switching mode circuit; and
  a shunt inductive element coupled to said output of said switching mode circuit, wherein said shunt inductive element includes an inductive bias line for said switching mode circuit.

33. The invention of claim 32 wherein said series inductive-capacitive network includes an inductive element coupled to said output of said switching mode circuit.

34. The invention of claim 33 wherein said series inductive-capacitive network further includes a capacitive element coupled in series to said inductive element.

* * * * *